United States Patent
Kong et al.

(10) Patent No.: US 11,915,985 B2
(45) Date of Patent: Feb. 27, 2024

(54) DETECTION STRUCTURE AND DETECTION METHOD

(71) Applicant: CHONGQING KONKA PHOTOELECTRIC TECHNOLOGY RESEARCH INSTITUTE CO., LTD., Chongqing (CN)

(72) Inventors: Qin Kong, Chongqing (CN); Chien-Hung Lin, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 183 days.

(21) Appl. No.: 17/533,800

(22) Filed: Nov. 23, 2021

(65) Prior Publication Data
US 2022/0148930 A1   May 12, 2022

Related U.S. Application Data

(63) Continuation of application No. PCT/CN2021/087094, filed on Apr. 14, 2021.

(30) Foreign Application Priority Data

Nov. 11, 2020 (CN) .......................... 202011253675.9

(51) Int. Cl.
*H01L 21/66* (2006.01)
*H01L 25/075* (2006.01)
(Continued)

(52) U.S. Cl.
CPC .............. *H01L 22/20* (2013.01); *H01L 24/83* (2013.01); *H01L 25/0753* (2013.01);
(Continued)

(58) Field of Classification Search
None
See application file for complete search history.

(56) References Cited

U.S. PATENT DOCUMENTS 10,269,779 B2 *  4/2019  Lu ......................... H01L 33/382
10,396,137 B2    8/2019  Cok et al.
(Continued)

FOREIGN PATENT DOCUMENTS

CN   105304517 A   2/2016
CN   109119356 A   1/2019
(Continued)

OTHER PUBLICATIONS

The first office action issued in corresponding CN application No. 202011253675.9 dated Feb. 16, 2022.
(Continued)

*Primary Examiner* — Bo B Jang
(74) *Attorney, Agent, or Firm* — HAUPTMAN HAM, LLP

(57) ABSTRACT

A detection structure and a detection method are provided. The method includes the following. A display backplane, a detection circuit board, and a detection light-emitting diode (LED) chip are provided. The detection circuit board is disposed on the display backplane, to connect a first detection line on the detection circuit board with a first contact electrode and connect a second detection line on the detection circuit board with a second contact electrode. A drive signal is output via the display backplane to the first detection line and the second detection line. A contact electrode pair on the display backplane corresponding to the detection LED chip is determined to be abnormal on condition that the detection LED chip is unlighted.

17 Claims, 14 Drawing Sheets

(51) Int. Cl.
  *H01L 27/12*    (2006.01)
  *H01L 25/16*    (2023.01)
  *H01L 23/00*    (2006.01)
(52) U.S. Cl.
  CPC ........ *H01L 27/1259* (2013.01); *H01L 25/167* (2013.01); *H01L 2224/83052* (2013.01); *H01L 2224/83191* (2013.01); *H01L 2224/83194* (2013.01)

(56) References Cited

U.S. PATENT DOCUMENTS

| | | | |
|---|---|---|---|
| 10,741,739 B2* | 8/2020 | He | .......................... H01L 24/29 |
| 2020/0013318 A1 | 1/2020 | Pappas et al. | |
| 2020/0013686 A1 | 1/2020 | Kao et al. | |

FOREIGN PATENT DOCUMENTS

| | | |
|---|---|---|
| CN | 110265348 A | 9/2019 |
| CN | 111199700 A | 5/2020 |
| CN | 111398773 A | 7/2020 |
| CN | 111463230 A | 7/2020 |
| CN | 111524936 A | 8/2020 |
| CN | 111596476 A | 8/2020 |

OTHER PUBLICATIONS

The International Search Report issued in corresponding International Application No. PCT/CN2021/087094, dated Jul. 27, 2021, pp. 1-8, Beijing, China.

* cited by examiner

DETECTION STRUCTURE AND DETECTION METHOD

CROSS-REFERENCE TO RELATED APPLICATION(S)

This application is a continuation of International Application No. PCT/CN2021/087094, filed on Apr. 14, 2021, which claims priority to Chinese Patent Application No. 202011253675.9, filed on Nov. 11, 2020, the entire disclosures of which are hereby incorporated by reference.

TECHNICAL FIELD

This disclosure relates to the technical field of display, and in particular to a detection structure and a detection method.

BACKGROUND

Micro light-emitting diode (micro-LED) displays have great application prospects due to several advantages, such as good stability, long service life, and low operating temperature, and advantages inherited from LEDs, such as low power consumption, high color saturation, high response speed, and strong contrast. A micro-LED display backplane includes one or more pixel regions, and each of the one or more pixel regions includes a red LED chip, a blue LED chip, and a green LED chip. During display manufacture, the red, blue, and green LED chips may be transferred from respective growth substrates (such as wafers) to the display backplane. However, if any of the LED chips is damaged/in poor contact, a fault point will appear on the display backplane after transfer, which will influence an imaging effect.

At current, a method to solve the foregoing problems is to find out a location of the fault point through detection of whether the LED chip can be lit, and the detection method is generally to light the LED chip after mass transfer, and detect the location of the fault point by detecting an emitting beam of the LED chip. Sometimes, the fault point is not caused by a damaged LED chip. Rather, a damaged display backplane may lead to an unlighted LED chip. However, there is currently no solution for display backplane detection before mass transfer.

Therefore, how to detect a display backplane before mass transfer is a problem to be solved.

SUMMARY

A detection structure is provided. The detection structure is configured to detect a display backplane and includes a detection circuit board and a detection light-emitting diode (LED) chip. The detection circuit board includes one or more first detection lines and one or more second detection lines, which are disposed at intervals on one side of the detection circuit board facing the display backplane, and one or more first detection electrodes and one or more second detection electrodes, which are disposed at intervals on one side of the detection circuit board away from the display backplane, where the first detection electrode is electrically connected with the first detection line and the second detection electrode is electrically connected with the second detection line. The detection LED chip includes a first electrode and a second electrode, where the first electrode is electrically connected with the first detection electrode and the second electrode is electrically connected with the second detection electrode. The display backplane has one or more contact electrode pairs arranged in a matrix, where the contact electrode pairs each include a first contact electrode and a second contact electrode, the first detection line is configured to be electrically connected with the first contact electrode, and the second detection line is configured to be electrically connected with the second contact electrode.

In some implementations, the first detection electrode and the second detection electrode are disposed on the first detection line and the second detection line in a same detection line group. A distance between the first detection line and the second detection line in the same detection line group is greater than a distance between two adjacent sides of the first contact electrode and the second contact electrode in a same contact electrode pair, and is less than a distance between two opposite sides of the first contact electrode and the second contact electrode in the same contact electrode pair. A distance between the first detection line and the second detection line in adjacent detection line groups is greater than the distance between the two opposite sides of the first contact electrode and the second contact electrode in the same contact electrode pair.

In some implementations, the display backplane includes a substrate, a circuit layer, and a planarization layer. The circuit layer is disposed on a surface of the substrate and includes a drive circuit, where the drive circuit is configured to be electrically connected with the first detection line and the second detection line. The circuit layer is covered by the planarization layer, and the first contact electrode and the second contact electrode are disposed on a surface of the planarization layer.

In some implementations, the detection LED chip is an LED flip chip and includes a first electrode and a second electrode, where the first electrode is electrically connected with the first detection electrode and the second electrode is electrically connected with the second detection electrode.

A detection method is provided. The detection method is applied to the above detection structure and includes the following. The display backplane, the detection circuit board, and the detection LED chip are provided. The detection circuit board is disposed on the display backplane, to connect the first detection line with the first contact electrode and connect the second detection line with the second contact electrode. The display backplane outputs a drive signal to the first detection line and the second detection line. The contact electrode pair on the display backplane corresponding to the detection LED chip is determined to be abnormal on condition that the detection LED chip is unlighted.

In some implementations, the method further includes the following. After outputting the drive signal via the display backplane to the first detection line and the second detection line, the detection circuit board is separated from the display backplane and the abnormal contact electrode pair on the display backplane is repaired for mass transfer.

In some implementations, the detection circuit board is disposed on the display backplane as follows, to connect the first detection line with the first contact electrode and connect the second detection line with the second contact electrode. The detection circuit board is disposed on the display backplane, and first alignment is performed, to connect the first detection line with the first contact electrode in each odd column of the display backplane and connect the second detection line with the second contact electrode in each odd column of the display backplane. The detection circuit board is moved after completing detection for the contact electrode pairs in odd columns of the display backplane, and second alignment is performed, to connect the first detection line with the first contact electrode in each even column of the display backplane and connect the second detection line with the second contact electrode in each even column of the display backplane.

In some implementations, the method further includes the following. Before disposing the detection circuit board on the display backplane, to connect the first detection line with the first contact electrode and connect the second detection line with the second contact electrode, multiple photoresist portions are provided on the display backplane along a column direction of the display backplane, where each of the photoresist portions are located between adjacent contact electrode pairs in multiple contact electrode pairs in each odd column, or each of the photoresist portions are located between adjacent contact electrode pairs in multiple contact electrode pairs in each even column. The photoresist portions located between adjacent contact electrode pairs in the multiple contact electrode pairs in each odd column are removed after completing detection for the contact electrode pairs in the odd columns of the display backplane, and the photoresist portions are provided between adjacent contact electrode pairs in multiple contact electrode pairs in each even column. Alternatively, the photoresist portions located between adjacent contact electrode pairs in the multiple contact electrode pairs in each even column are removed after completing detection for the contact electrode pairs in the even columns of the display backplane, and the photoresist portions are provided between adjacent contact electrode pairs in multiple contact electrode pairs in each odd column.

In some implementations, the photoresist portions each have a height lower than or equal to the contact electrode pair.

In some implementations, the detection circuit board is disposed on the display backplane as follows, to connect the first detection line with the first contact electrode and connect the second detection line with the second contact electrode. The detection circuit board is pressed on the display backplane via a weight.

A detection method is provided. The detection method is applied to the above detection structure and includes the following. The display backplane, the detection circuit board, and the detection LED chip are provided. The detection circuit board is disposed on the display backplane, to connect the first detection line with the first contact electrode and connect the second detection line with the second contact electrode. A drive signal is outputted via the display backplane to the first detection line and the second detection line. The drive circuit applies on the display backplane an electrical signal to the first detection line and the second detection line row by row. The contact electrode pair on the display backplane corresponding to the detection LED chip is determined to be abnormal on condition that the detection LED chip is unlighted. The detection circuit is separated from the display backplane and the abnormal contact electrode pair on the display backplane is repaired for mass transfer.

Reference numbers in the figures are illustrated as follows.

100: display backplane; 101: first contact electrode; 102: second contact electrode; 103: substrate; 104: circuit layer; 1041: buffer layer; 1042: gate insulating layer; 1043: interlayer insulating layer; 105: planarization layer; 106: thin film transistor (TFT); 107: gate line contact point; 108: signal line contact point; 109: first hole; 110: pixel region; 200: detection circuit board; 201: first detection line; 202: second detection line; 203: first detection electrode; 204: second detection electrode; 205: second hole; 300: detection LED chip; 301: first electrode; 302: second electrode; 303:

first semiconductor layer; 304: second semiconductor layer; 305: light emitting layer; 400: photoresist portion; 500: weight.

DETAILED DESCRIPTION

In order to facilitate understanding of the present disclosure, a detailed description will now be given with reference to relevant accompanying drawings. The accompanying drawings illustrate some examples of implementations of the present disclosure. However, the present disclosure can be implemented in many different forms and is not limited to the implementations described herein. On the contrary, these implementations are provided for a more thorough and comprehensive understanding of the present disclosure.

Unless otherwise defined, all technical and scientific terms used herein have the same meaning as commonly understood by those skilled in the art of the present disclosure. The terms used herein in the disclosure are for the purpose of describing implementations only and are not intended to limit the disclosure.

Figure 1:
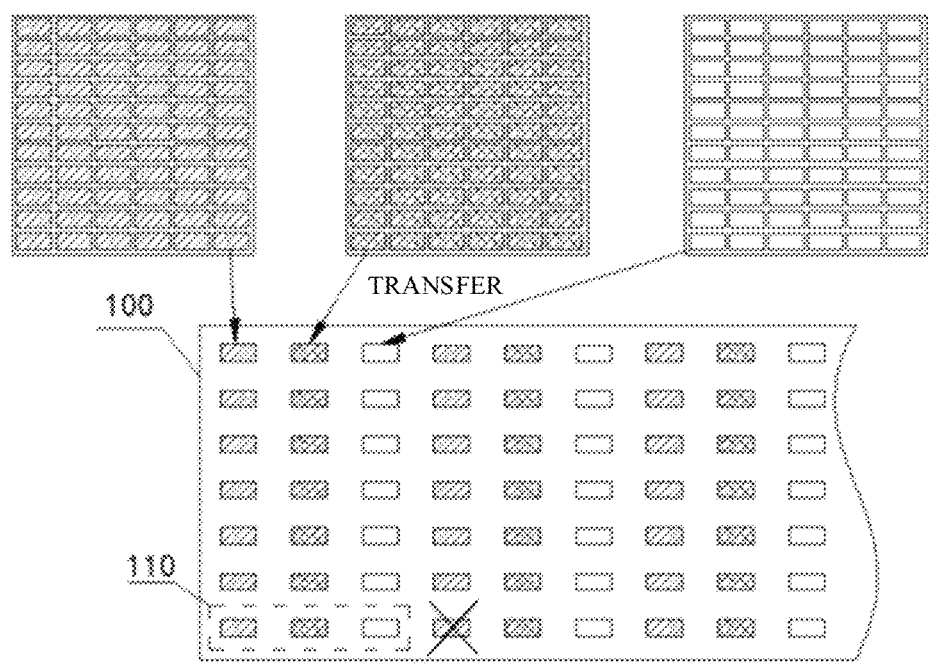
FIG. 1 is a schematic diagram illustrating a process for display manufacture in the related art.
Figure 2:
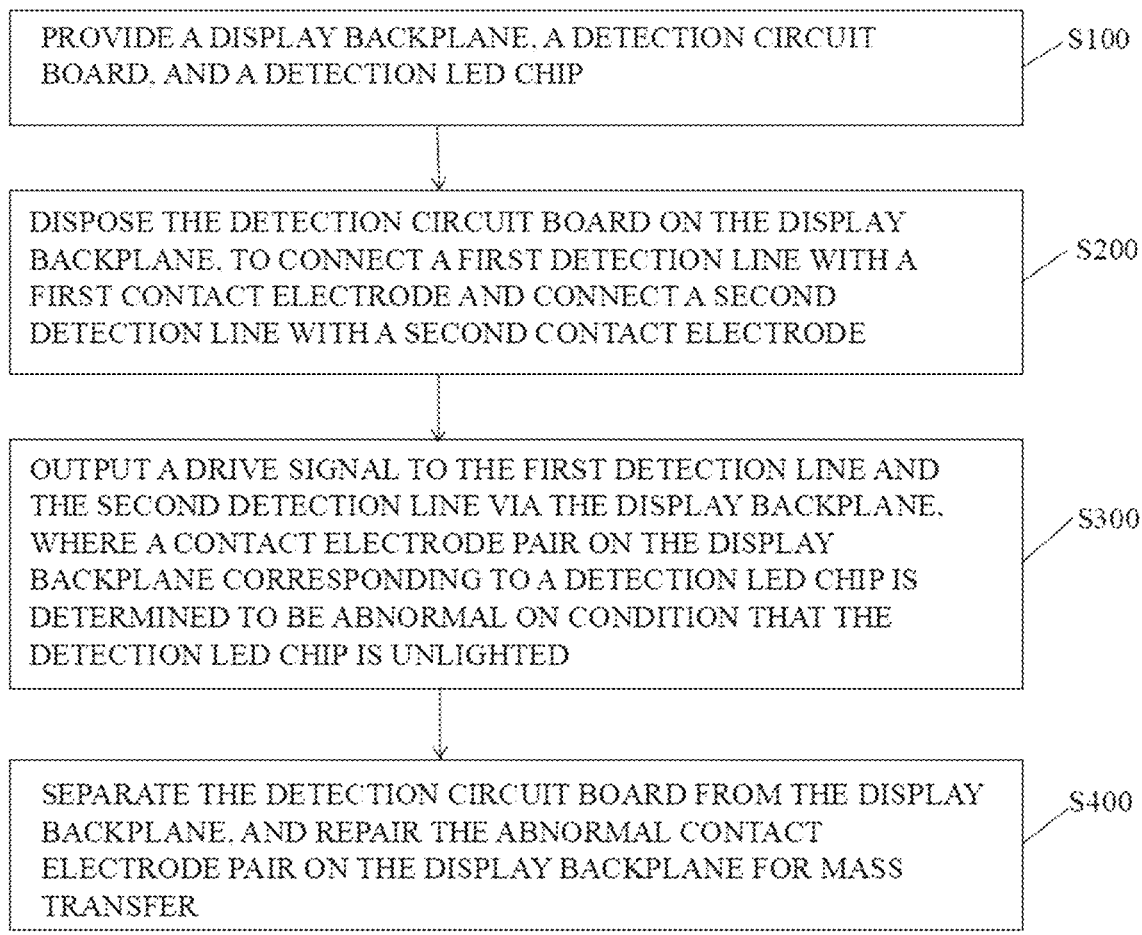
FIG. 2 is a schematic flow chart illustrating a detection method for a display backplane according to implementations of the disclosure.

As illustrated in FIG. 1, a micro light-emitting diode (micro-LED) display backplane 100 includes one or more pixel regions 110, and each of the one or more pixel regions 110 includes a red LED chip, a blue LED chip, and a green LED chip. During display manufacture, the red, blue, and green LED chips may be transferred from respective growth substrates (a growth substrate of the red LED, a growth substrate of the blue LED, and a growth substrate of the green LED) to the display backplane 100. However, if any of the LED chips is damaged/in poor contact, as illustrated at "X" location in FIG. 1, a fault point will appear on the display backplane after transfer, which will influence an imaging effect.

At current, a method for detecting the fault point on the display backplane 100 is generally to light the LED chip after mass transfer and detect a location of the fault point by detecting an emitting beam of the LED chip, or to detect separately an LED epitaxy on the growth substrate before mass transfer. Sometimes, the fault point is not caused by a damaged LED chip. Rather, a damaged display backplane 100 may lead to an unlighted LED chip. However, there is currently no solution for display backplane detection before mass transfer.

Based on the above, a solution is provided in the disclosure, to solve the above-mentioned technical problems. The solution will be explained in details in the following implementations. Considering disadvantages of the above-mentioned related art, in this disclosure, a detection structure and a detection method are provided, which is possible to solve the problem that the display backplane cannot be detected before mass transfer.

As illustrated in FIG. 3 to FIG. 15, a detection structure is provided. The detection structure is configured to detect a display backplane 100 and includes a detection circuit board 200 and a detection LED chip 300. The detection circuit board 200 includes one or more first detection lines 201 and one or more second detection lines 202 as well as one or more first detection electrodes 203 and one or more second detection electrodes 204. The first detection lines 201 and the second detection lines 202 are disposed at intervals on one side of the detection circuit board 200 facing the display backplane 100. The first detection electrodes 203 and the second detection electrodes 204 are disposed at intervals on one side of the detection circuit board 200 away from the display backplane 100. That is, the first detection electrodes 203 and the second detection electrodes 204 as well as the first detection lines 201 and the second detection lines 202 are disposed on two opposite sides of the detection circuit board 200. The first detection electrode 203 is electrically connected with the first detection line 201 and the second detection electrode 204 is electrically connected with the second detection line 202. The detection LED chip 300 includes a first electrode 301 and a second electrode 302, where the first electrode 301 is electrically connected with the first detection electrode 203 and the second electrode 302 is electrically connected with the second detection electrode 204. The first detection electrode 203 is electrically connected with the first detection line 201 through a second hole 205, and the second detection electrode 204 is electrically connected with the second detection line 202 through a second hole 205. The display backplane 100 has one or more contact electrode pairs arranged in a matrix, where the contact electrode pairs each include a first contact electrode 101 and a second contact electrode 102, the first detection line 201 is configured to be electrically connected with the first contact electrode 101, and the second detection line 202 is configured to be electrically connected with the second contact electrode 102.

Figure 3:
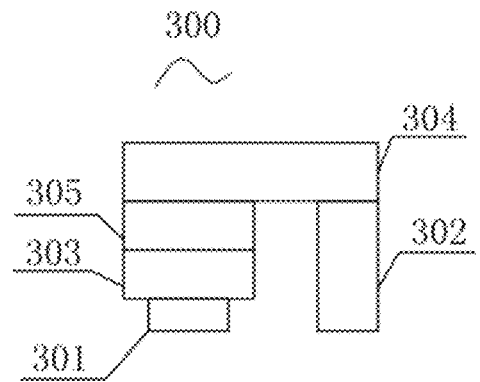
FIG. 3 is a schematic structural diagram illustrating a detection light-emitting diode (LED) chip according to implementations of the disclosure.

The detection LED chip is an LED flip chip because a micro-LED display generally adopts the LED flip chip. As illustrated in FIG. 3, in an implementation, the detection LED chip 300 includes the first electrode 301, the second electrode 302, a first semiconductor layer 303, a second semiconductor layer 304, and a light emitting layer 305. The first semiconductor layer 303 may be an N/P-type doped gallium nitride (GaN) layer, the light emitting layer 305 may be a quantum well layer, and the second semiconductor layer 304 may be a P/N-type doped GaN layer. The first electrode 301 the second electrode 302 are made of a conductive material such as a metal. Collisions and recombination of electrons in an N-type semiconductor and holes in a P-type semiconductor generate photons in the light emitting layer 305 to excite energy in form of photons when applying an electrical signal to the first electrode 301 the second electrode 302. The first electrode 301 the second electrode 302 each may be made of aluminium (Al), platinum (Pt), palladium (Pd), argentum (Ag), magnesium (Mg), aurum (Au), nickel (Ni), neodymium (Nd), iridium (Lr), chromium (Cr), lithium (Li), calcium (Ca), molybdenum (Mo), titanium (Ti), wolframium (W), cuprum (Cu), etc.

Figure 4:
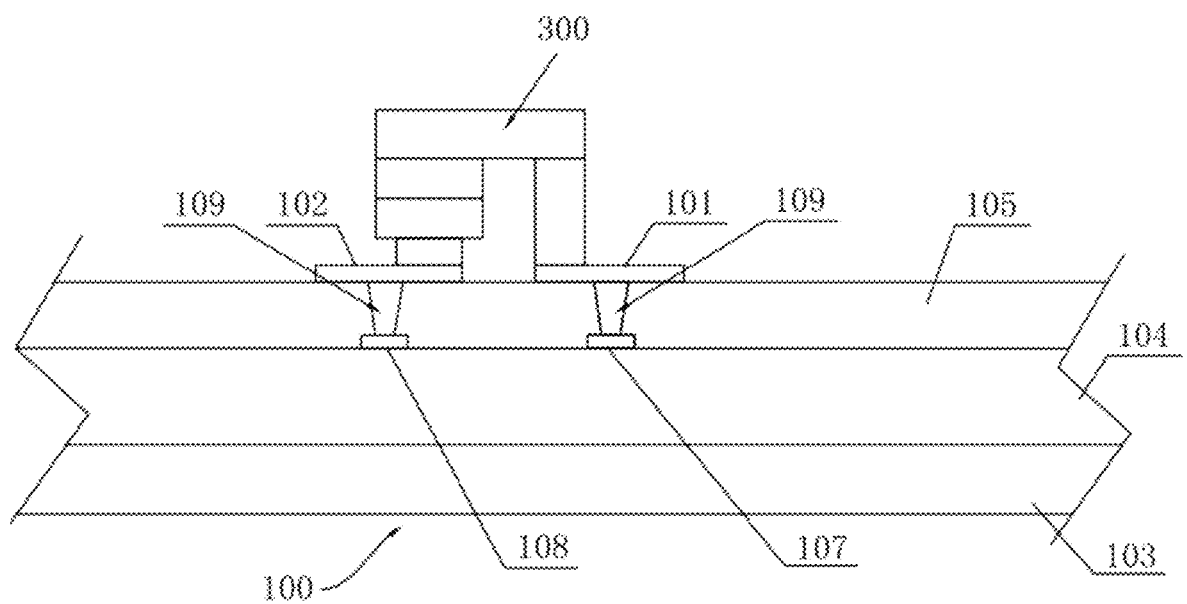
FIG. 4 is a schematic structural diagram illustrating a display backplane according to implementations of the disclosure.
Figure 5:
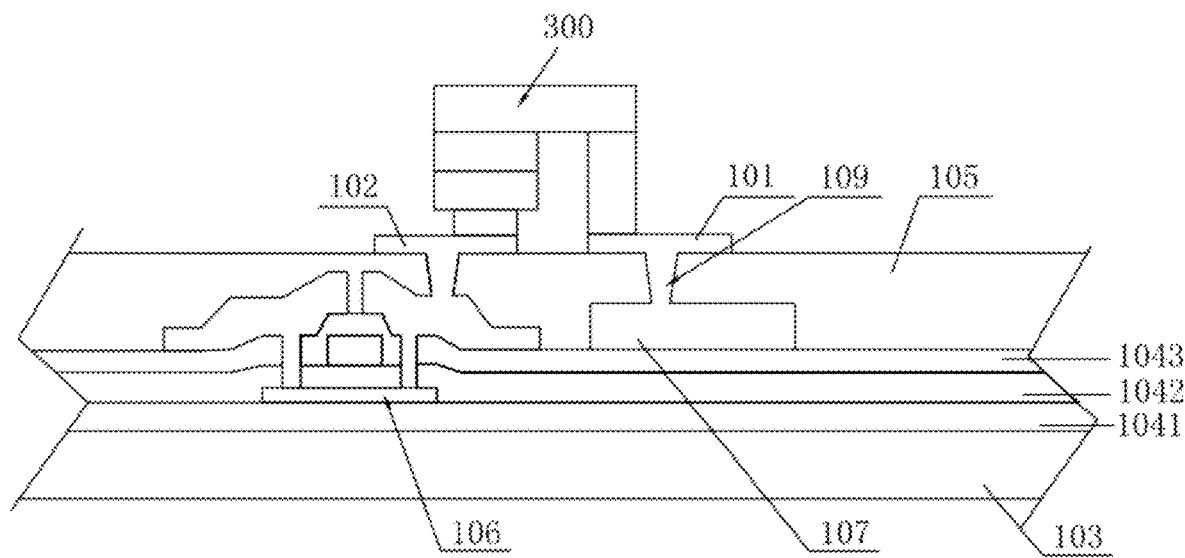
FIG. 5 is a schematic structural diagram illustrating a circuit layer of the display backplane according to implementations of the disclosure.
Figure 6:
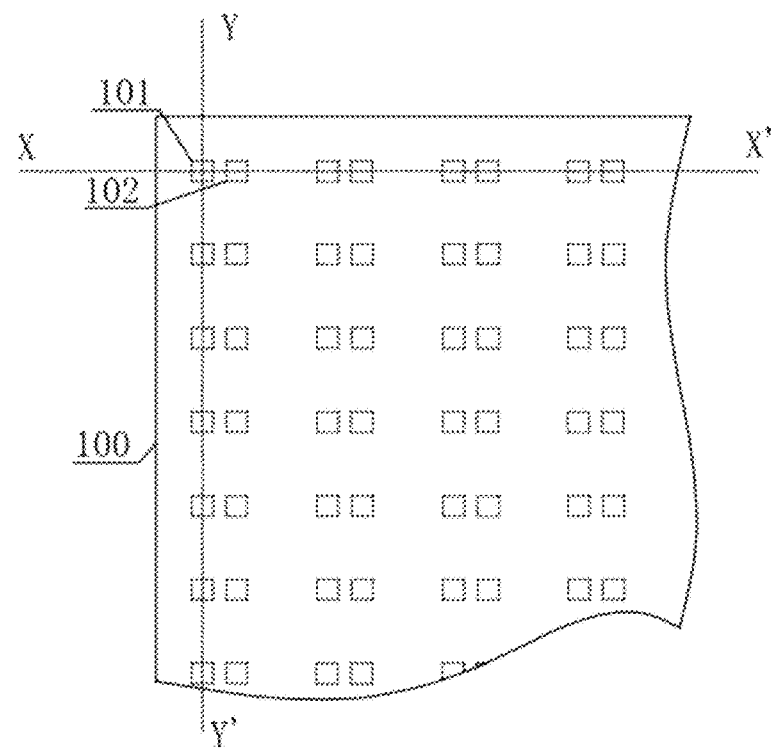
FIG. 6 is a schematic diagram illustrating a display backplane of a display before mass transfer according to implementations of the disclosure.
Figure 7:
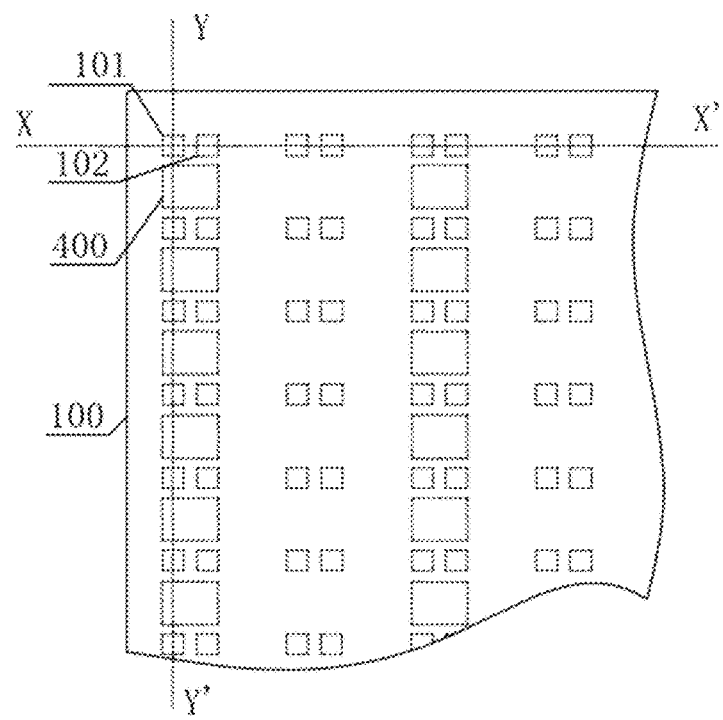
FIG. 7 is a schematic diagram illustrating photoresist portions located between adjacent contact electrode pairs in multiple contact electrode pairs in each odd column according to implementations of the disclosure.
Figure 8:
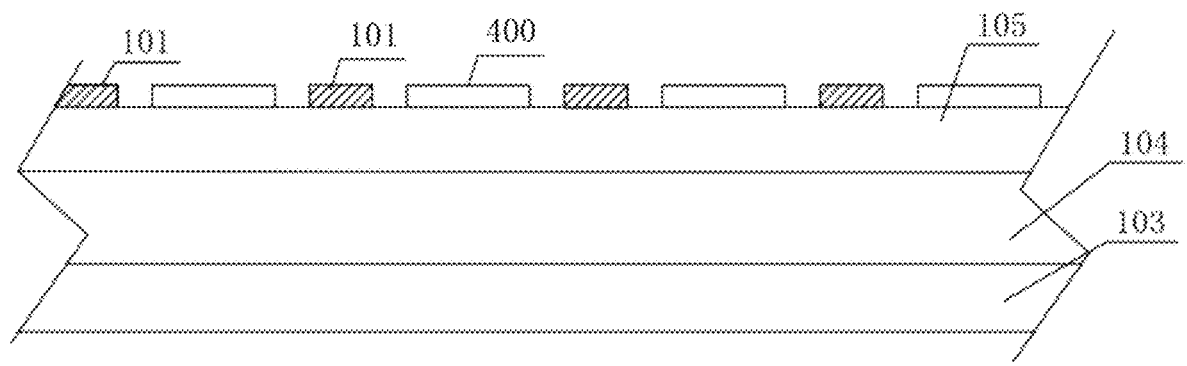
FIG. 8 is a sectional view in the YY' direction in FIG. 7.
Figure 9:
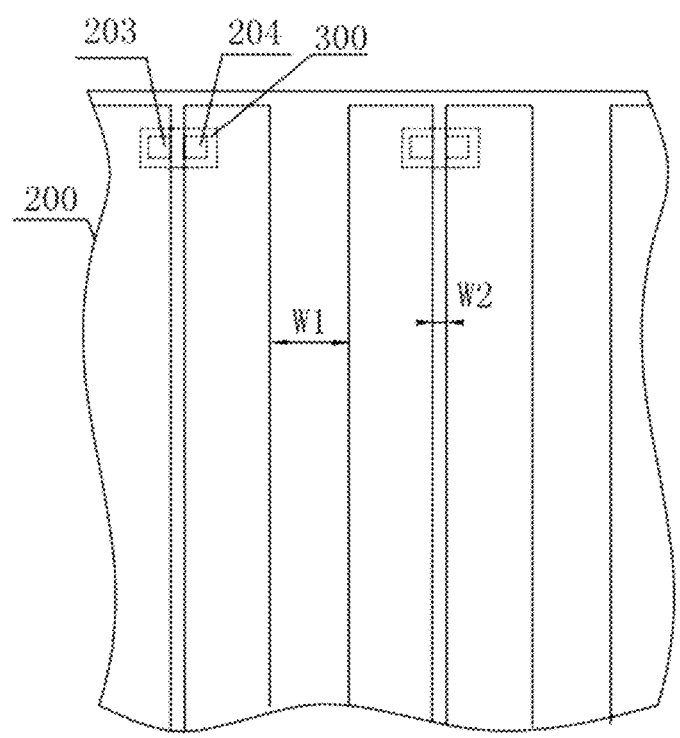
FIG. 9 is a schematic diagram illustrating a side of a detection circuit board facing a display backplane according to implementations of the disclosure.
Figure 10:
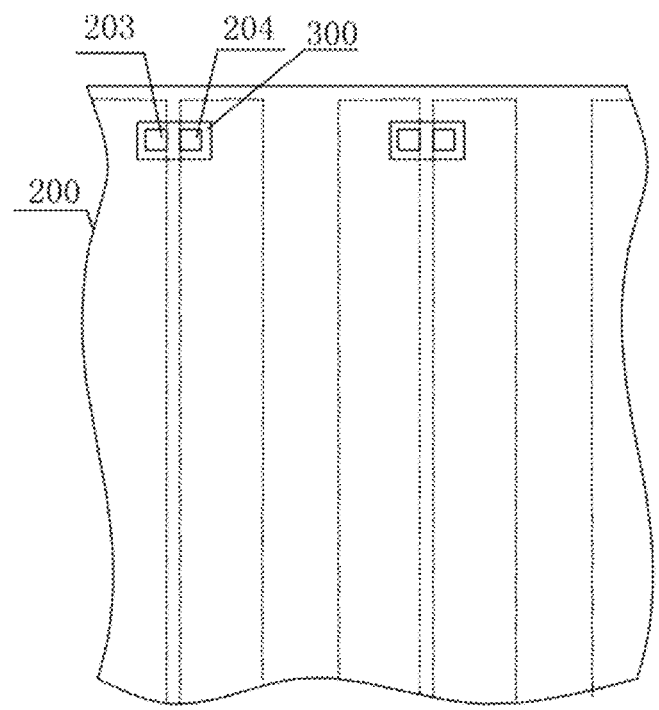
FIG. 10 is a schematic diagram 1 illustrating a side of a detection circuit board away from a display backplane according to implementations of the disclosure.
Figure 11:
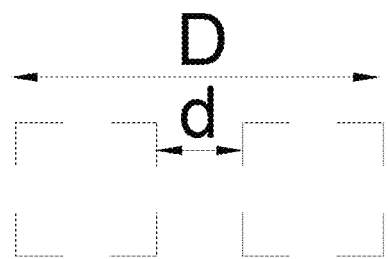
FIG. 11 is a schematic diagram illustrating distances between a first contact electrode and a second contact electrode in a same contact electrode pair.
Figure 12:
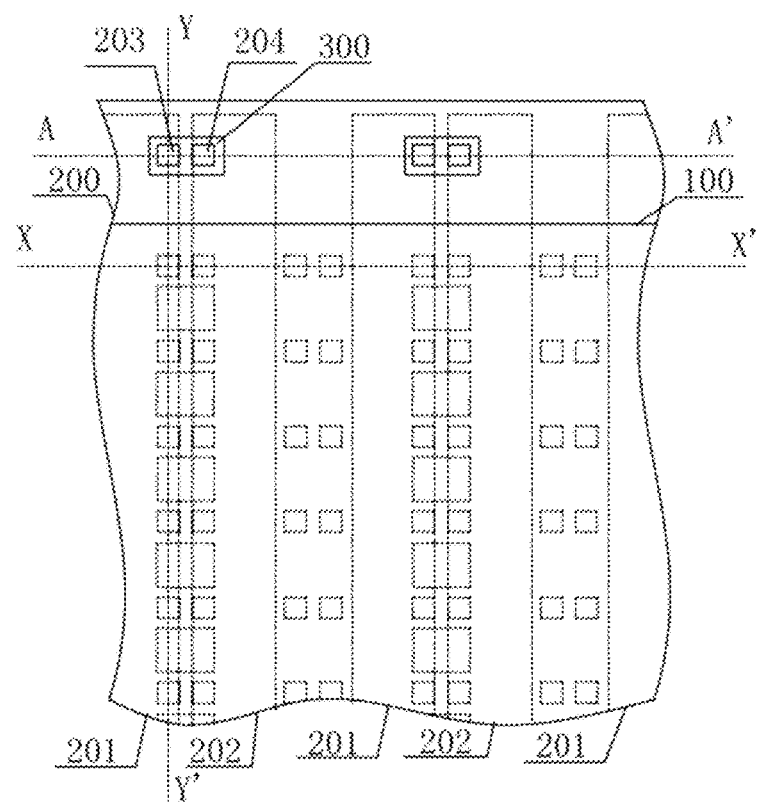
FIG. 12 is a schematic diagram 2 illustrating a side of a detection circuit board away from a display backplane according to implementations of the disclosure.
Figure 13:
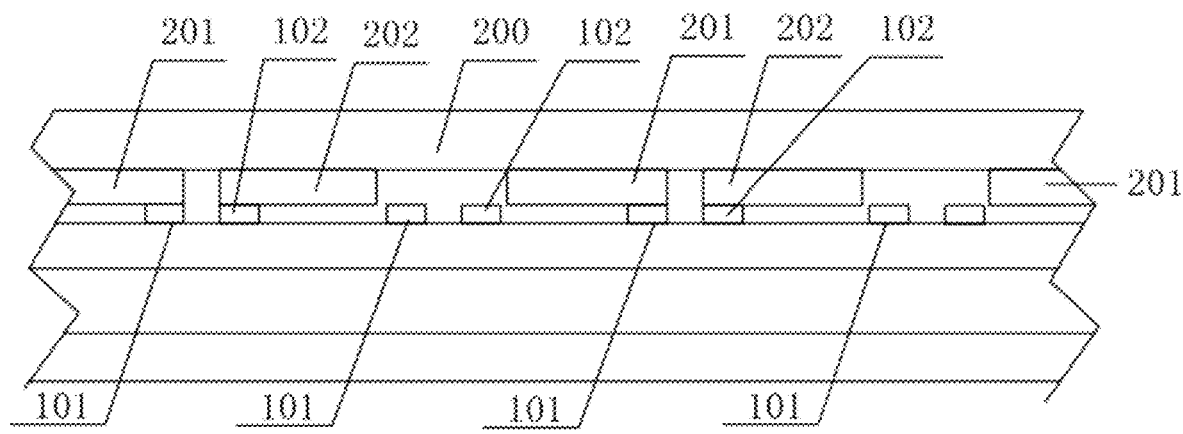
FIG. 13 is a sectional view in the XX' direction in FIG. 12.
Figure 14:
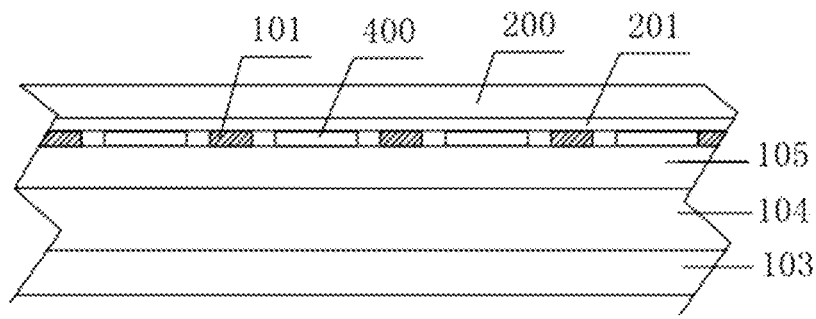
FIG. 14 is a sectional view in the YY' direction in FIG. 12.
Figure 15:
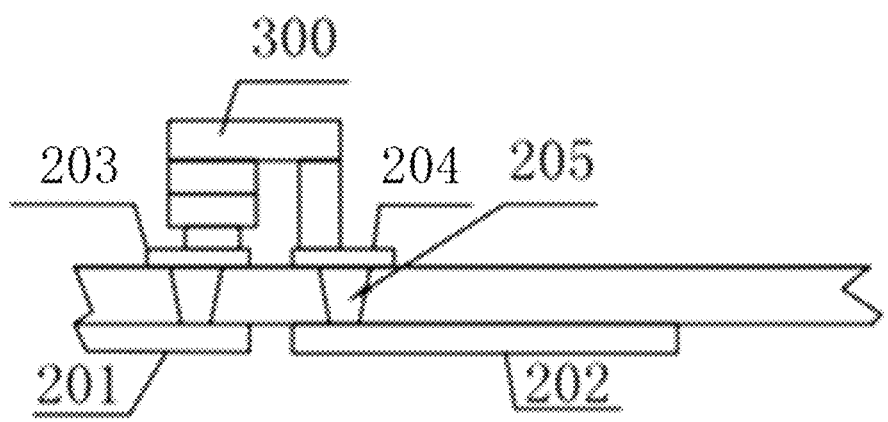
FIG. 15 is a schematic structural diagram illustrating a detection circuit board according to implementations of the disclosure.

As illustrated in FIG. 4 to FIG. 6, in an implementation, the display backplane 100 includes a substrate 103, a circuit layer 104, and a planarization layer 105. The circuit layer 104 is disposed on a surface of the substrate 103 and includes a drive circuit. The drive circuit is configured to be electrically connected with the first detection line 201 and the second detection line 202. The circuit layer 104 is covered by the planarization layer 105. The first contact electrode 101 and the second contact electrode 102 are disposed on a surface of the planarization layer 105.

The substrate 103 may be made of a transparent glass material, such as silicon dioxide (SiO2). The substrate 103 may also be made of a transparent plastic material, such as polyethersulfone (PES), polyacrylate (PAR), polyetherimide (PEI), polyethylene-naphthalate (PEN), polyethylene-terephthalate (PET), polyphenylene sulfide (PPS), polyallylate, polyimide, polycarbonate (PC), cellulose triacetate (TAC), cellulose acetate propionate (CAP), and other organic materials.

The circuit layer 104 includes the drive circuit for driving the detection LED chip 300. The drive circuit may include, for example, a thin film transistor (TFT) 106, a gate line, and a signal line. The drive circuit is configured to be electrically connected with the first detection line 201 and the second detection line 202 on the detection circuit board 200 for applying an electrical signal to the first detection line 201 and the second detection line 202.

The circuit layer 104 is covered by the planarization layer 105, which can eliminate a step difference on the circuit layer 104 and flatten the circuit layer 104. The planarization layer 105 may be made of an organic material, such as polymethylmethacrylate (PMMA) or polystyrene (PS), a polymer derivative having a phenol group, acryl-based polymer, imide-based polymer, aryl ether-based polymer, amide-based polymer, fluorine-based polymer, p-xylene-based polymer, vinyl alcohol-based polymer, or a blend thereof.

The first contact electrode 101 and the second contact electrode 102 may be disposed on the surface of the planarization layer 105 and be connected with the signal line or the gate line (the gate line can transmit an on/off signal to the TFT 106) in the circuit layer 104 through a filling material in a first hole 109 in the planarization layer 105. The first contact electrode 101 is bonded with the second electrode 302, and the second contact electrode 102 is bonded with the first electrode 301. The first contact electrode 101, the second contact electrode 102, the filling material in the first hole 109, the signal line, and the gate line each may be made of Al, Pt, Pd, Ag, Mg, Au, Ni, Nd, Tr, Cr, Li, Ca, Mo, Ti, W, Cu, etc.

As illustrated in FIG. 5, the circuit layer 104 may include a buffer layer 1041, a gate insulating layer 1042, an interlayer insulating layer 1043, a TFT 106, and a gate line contact point 107, etc.

The buffer layer 1041 is disposed on the substrate 103 and provides a substantially flat surface on the substrate 103 to reduce or avoid invasion of a foreign material or moisture to the substrate 103. In an implementation, the buffer layer 1041 may be made of an inorganic material such as silicon dioxide ($SiO_2$), silicon nitride (SiNx), silicon oxynitride (SiON), aluminum oxide ($Al_2O_3$), aluminium nitride (AlN), titanium dioxide ($TiO_2$), or titanium nitride (TiN). The buffer layer 1041 may also be made of an organic material such as polyimide, polyester, or propene.

The TFT 106 may include an active layer, a gate, a source, and a drain. As illustrated in FIG. 5, the TFT 106 is a top-gate thin film transistor (the TFT 106 may also be a bottom-gate thin film transistor in fact). The active layer may be made of a semiconductor material such as amorphous silicon or polycrystalline silicon. The active layer may also be made of other materials such as an organic semiconductor material or an oxide semiconductor material. The gate/source/drain may be made of a low resistance metallic material such as Al, Pt, Pd, Ag, Mg, Au, Ni, Nd, Ir, Cr, Li, Ca, Mo, Ti, W, Cu, etc.

The gate insulating layer, used to insulate the gate and the active layer, may be made of an inorganic material such as $SiO_2$, SiNx, SiON, $Al_2O_3$, $TiO_2$, tantalum oxide ($Ta_2O_5$), hafnium oxide ($HfO_2$), or zinc oxide ($ZnO_2$), etc.

The interlayer insulating layer 1043 is used to insulate the source and the gate or insulate the drain and the gate. The interlayer insulating layer 1043 may be made of an inorganic material such as $SiO_2$, SiNx, SiON, $Al_2O_3$, $TiO_2$, $Ta_2O_5$, $HfO_2$ or $ZnO_2$, etc.

The gate line contact point 107 may be formed on one of insulating films disposed below the planarization layer 105 and may be formed above the interlayer insulating layer 1043 and the gate insulating layer 1042.

During detection, the detection circuit board 200 is disposed on the display backplane 100, such that the first detection line 201 is connected with the first contact electrode 101 and the second detection line 202 is connected with the second contact electrode 102. The display backplane 100 outputs a drive signal to the first detection line 201 and the second detection line 202. The contact electrode pair on the display backplane corresponding to the detection LED chip 300 is abnormal on condition that the detection LED chip 300 is unlighted. The abnormal contact electrode pair can be repaired for mass transfer after detection. Therefore, according to this disclosure, a possible defect in the display backplane 100 can be detected before mass transfer. During detection, a damage on the display backplane 100 can be detected in time without a cumbersome process of mass transfer, which can avoid the problem of not being able to confirm whether the micro LED chip or the display backplane 100 is damaged when a fault points appears on the display backplane 100 after mass transfer.

In an implementation, the first detection electrode 203 and the second detection electrode 204 are disposed on the first detection line 201 and the second detection line 202. The first detection line 201 and the second detection line 202 are included in a same detection line group. A distance W2 between the first detection line 201 and the second detection line 202 in the same detection line group is greater than or equal to a distance d between two adjacent sides (that is, sides facing each other) of the first contact electrode 101 and the second contact electrode 102 in a same contact electrode pair, and is less than or equal to a distance D between two opposite sides (that is, sides away from each other) of the first contact electrode 101 and the second contact electrode 102 in the same contact electrode pair. That is, d≤W2≤D. A distance W1 between the first detection line 201 and the second detection line 202 in adjacent detection line groups is greater than the distance D between the two opposite sides of the first contact electrode 101 and the second contact electrode 102 in the same contact electrode pair. That is, D<W1.

According to the above technical solution, the distance W2 between the first detection line 201 and the second detection line 202 in the same detection line group is greater than the distance d between the two adjacent sides of the first contact electrode 101 and the second contact electrode 102 in the same contact electrode pair, and is less than the distance D between the two opposite sides of the first contact electrode 101 and the second contact electrode 102 in the same contact electrode pair. As such, it can be ensured that the first detection line 201 is able to be connected with the first contact electrode 101 and the second detection line 202 is able to be connected with the second contact electrode 102. In addition, the distance W1 between the first detection line 201 and the second detection line 202 in the adjacent detection line groups is greater than the distance D between the two opposite sides of the first contact electrode 101 and the second contact electrode 102 in the same contact electrode pair, which can avoid short circuit occurred between the first detection line 201 and the second detection line 202 in the adjacent detection line groups.

As illustrated in FIG. 2 to FIG. 15, a detection method is provided. The detection method is applied to the above detection structure for display backplane detection and includes the following.

At S100, the display backplane 100, the detection circuit board 200, and the detection LED chip 300 are provided.

At S200, the detection circuit board 200 is disposed on the display backplane 100, to connect the first detection line 201 with the first contact electrode 101 and connect the second detection line 202 with the second contact electrode 102.

As illustrated in FIG. 12 to FIG. 15, the detection circuit board 200 with the detection LED chip 300 is disposed on the display backplane 100 after the detection LED chip 300 is welded on the detection circuit board 200, to connect the first detection line 201 with the first contact electrode 101 and connect the second detection line 202 with the second contact electrode 102, thus the detection circuit board 200 is electrically connected with the display backplane 100. As such, the first detection line 201 and the second detection line 202 can be electrically connected with a drive circuit in the display backplane 100, and the detection LED chip 300 can be electrically connected with the display backplane 100.

At S300, a drive signal is output to the first detection line 201 and the second detection line 202 via the display backplane 100, and the contact electrode pair on the display backplane 100 corresponding to the detection LED chip 300 is determined to be abnormal on condition that the detection LED chip 300 is unlighted.

Figure 16:
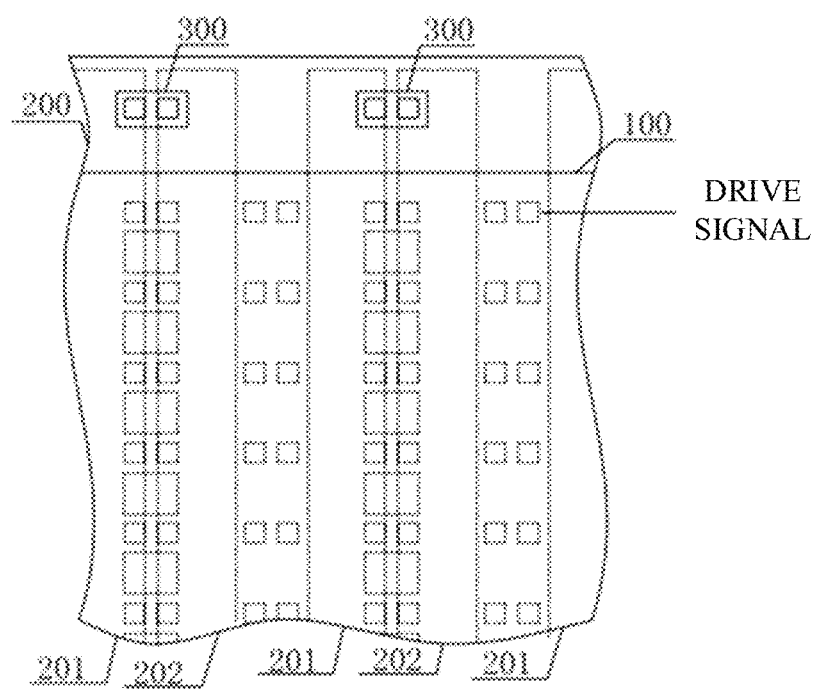
FIG. 16 is a schematic diagram illustrating a drive circuit on a display backplane outputting a drive signal to a detection circuit board row by row according to implementations of the disclosure.

As illustrated in FIG. 16, the drive circuit on the display backplane 100 applies an electrical signal to the first detection line 201 and the second detection line 202 row by row after the detection circuit board 200 is disposed on the display backplane 100, to drive the detection LED chip 300 to light. If the detection LED chip 300 is lighted, a contact electrode pair corresponding to the lighted detection LED chip is determined to be normal. If the detection LED chip 300 is unlighted, a contact electrode pair corresponding to the unlighted detection LED chip is determined to be abnormal.

Based on the above detection method for the display backplane, the detection circuit board 200 connected with the detection LED chip 300 is disposed on the display backplane 100, to connect the first detection line 201 with the first contact electrode 101 and connect the second detection line 202 with the second contact electrode 102. The drive signal is output via the display backplane 100 to the first detection line 201 and the second detection line 202. If the detection LED chip 300 is lighted, a contact electrode pair corresponding to the detection LED chip 300 is determined to be normal. If the detection LED chip 300 is unlighted, a contact electrode pair corresponding to the detection LED chip 300 is determined to be abnormal. After detection, the abnormal contact electrode pair can be repaired for mass transfer. Therefore, according to this disclosure, a possible defect in the display backplane 100 can be detected before mass transfer. During detection, a damage on the display backplane 100 can be detected in time without a cumbersome process of mass transfer, which can avoid the problem of not being able to confirm whether the micro-LED chip or the display backplane 100 is damaged when a fault point appears on the display backplane 100 after mass transfer.

In an implementation, the method further includes the following. After outputting the drive signal via the display backplane 100 to the first detection line 201 and the second detection line 202, at S400, the detection circuit board 200 is separated from the display backplane 100, and the abnormal contact electrode pair on the display backplane 100 is repaired for mass transfer.

Figure 17:
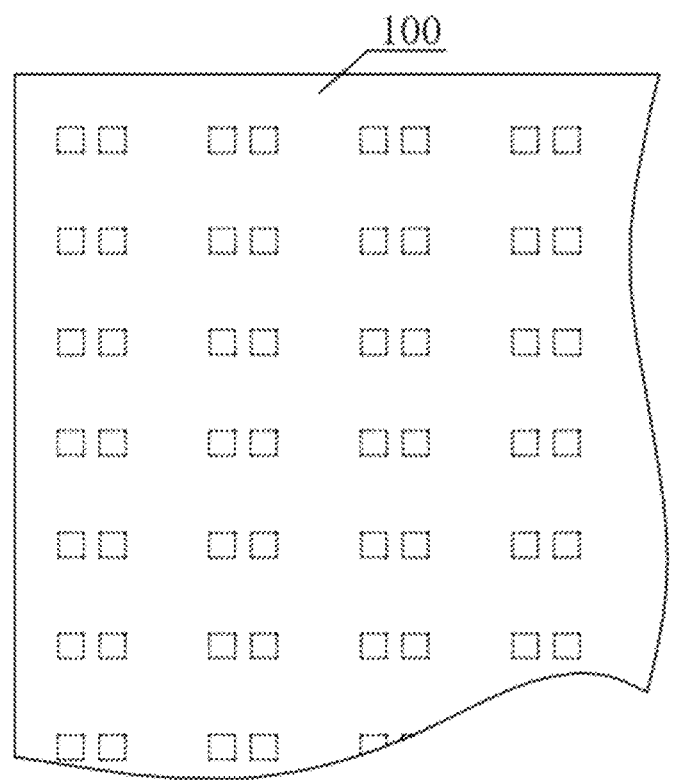
FIG. 17 is a schematic diagram illustrating a display backplane after detection.
Figure 18:
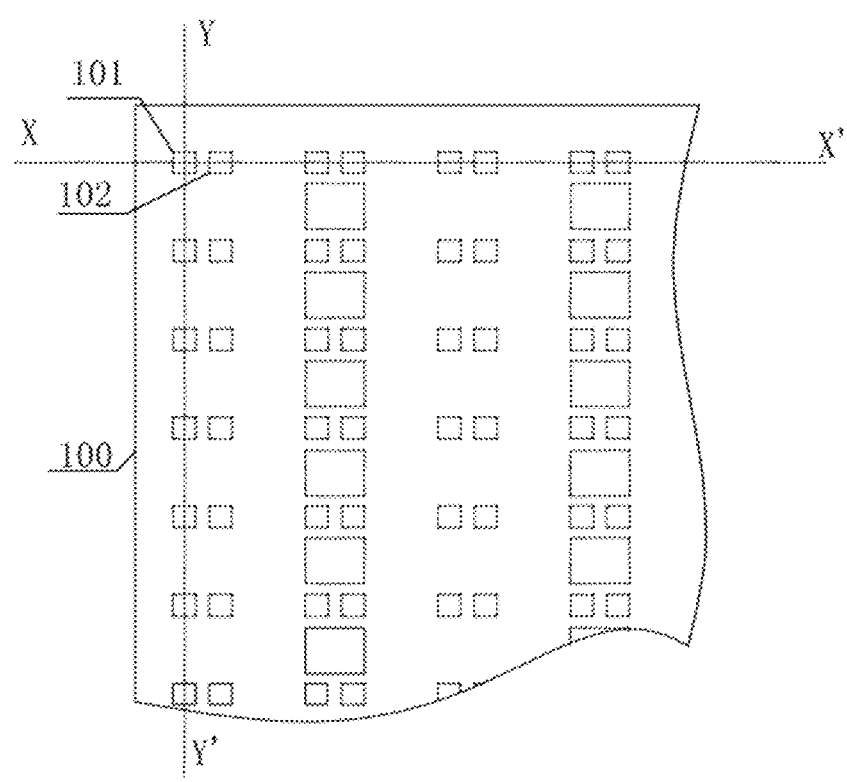
FIG. 18 is a schematic diagram illustrating photoresist portions located between adjacent contact electrode pairs in multiple contact electrode pairs in each even column according to implementations of the disclosure.
Figure 19:
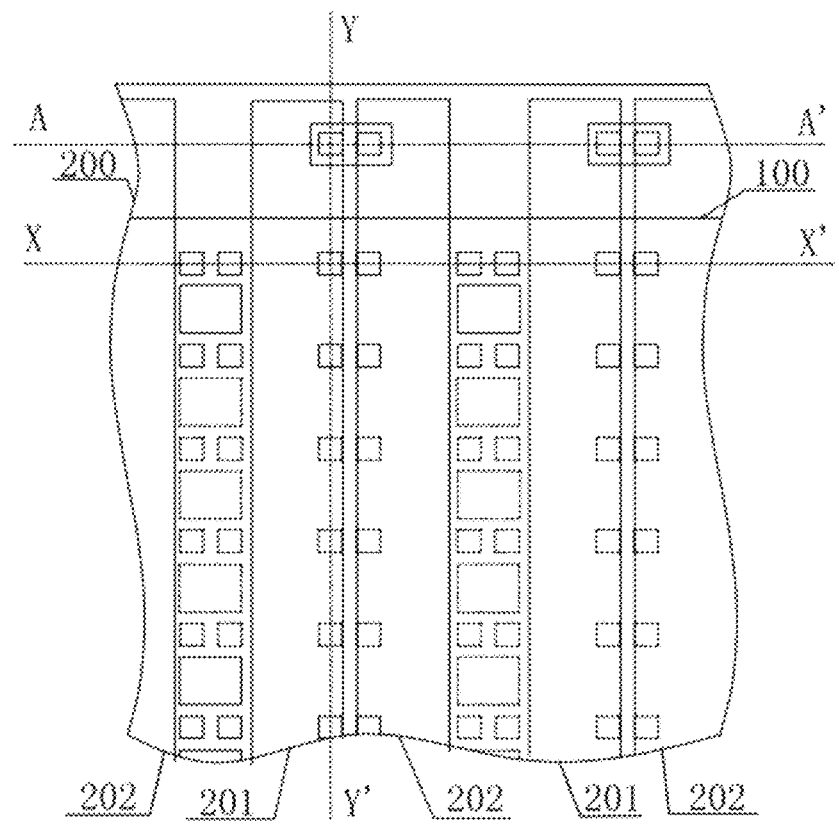
FIG. 19 is a schematic diagram 3 illustrating a side of a detection circuit board away from a display backplane according to implementations of the disclosure.
Figure 20:
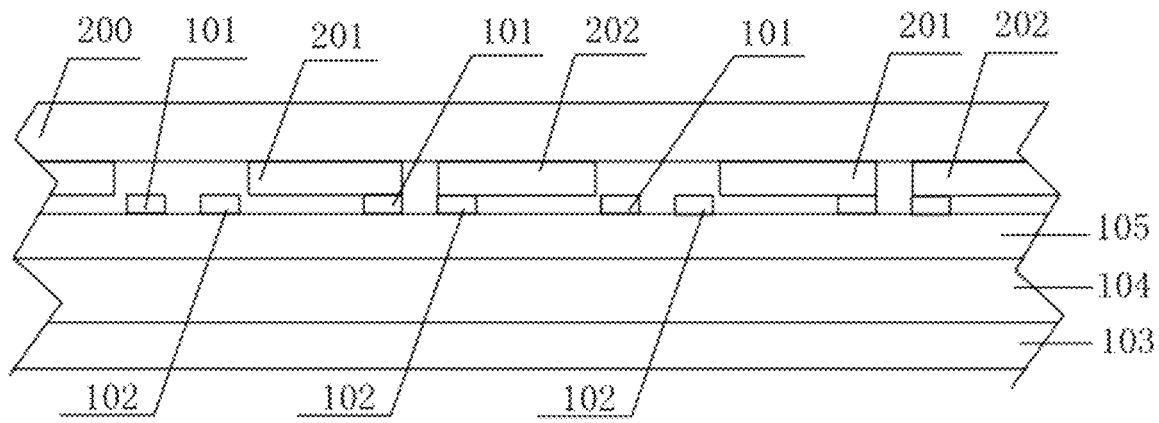
FIG. 20 is a sectional view in the XX' direction in FIG. 19.
Figure 21:
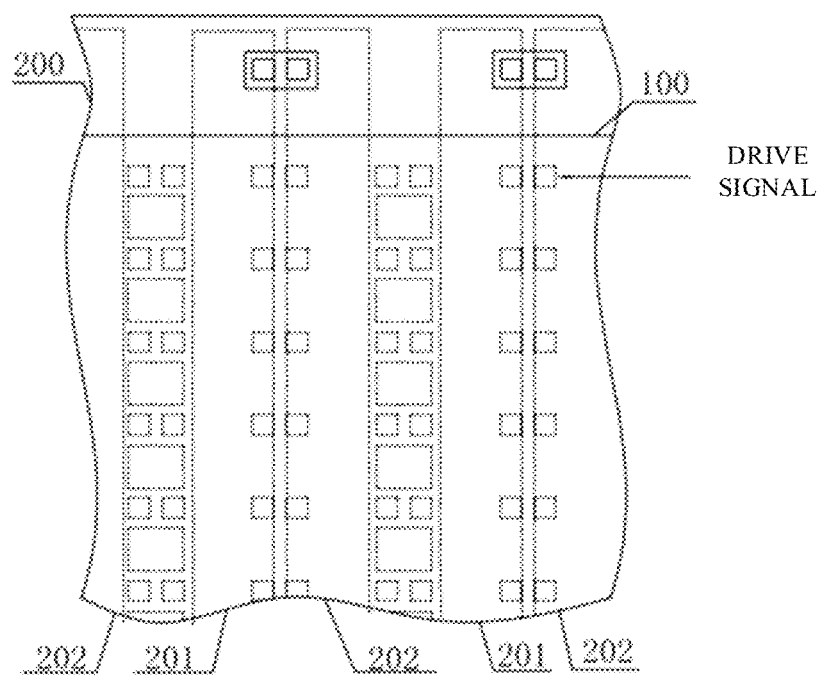
FIG. 21 is a schematic diagram illustrating a side of a detection circuit board away from a display backplane according to implementations of the disclosure.
Figure 22:
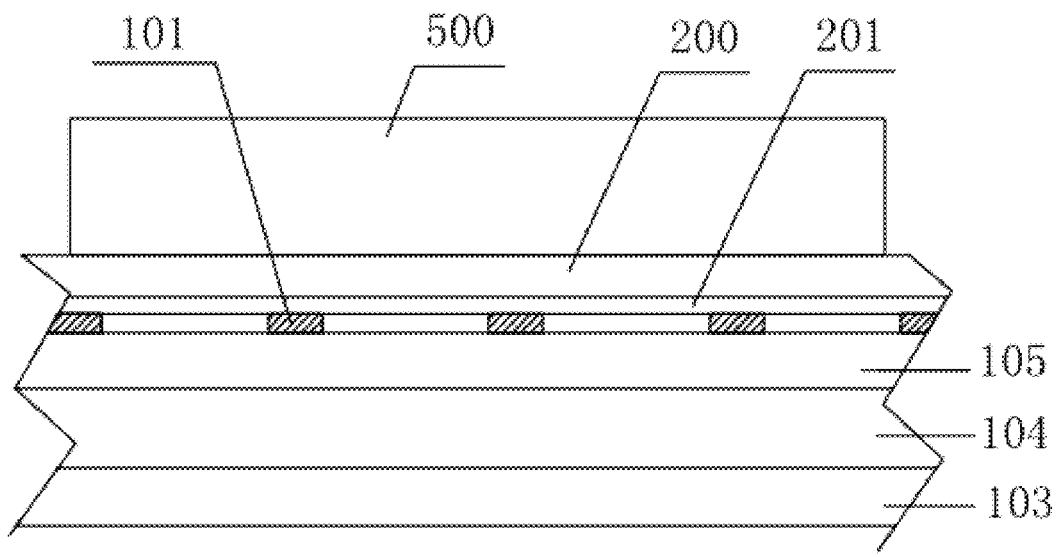
FIG. 22 is a schematic diagram illustrating a detection circuit board pressed on a display backplane via a weight according to implementations of the disclosure.

As illustrated in FIG. 16 and FIG. 17, the detection circuit board 200 is removed after detecting the display backplane 100 by the detection circuit board 200. The display backplane 100 is repaired, and the repaired display backplane 100 is prepared for mass transfer. As such, if a fault point appears in the following process, it can be determined that the fault point is not caused by a damage of the display backplane 100.

As illustrated in FIG. 2 to FIG. 21, in an implementation, the operation at S200 further includes the following. At S201, the detection circuit board 200 is disposed on the display backplane 100, and first alignment is performed, to connect the first detection line 201 with the first contact electrode 101 in each odd column of the display backplane 100 and connect the second detection line 202 with the second contact electrode 102 in each odd column of the display backplane 100. At S202, the detection circuit board 200 is moved after completing detection for the contact electrode pairs in odd columns of the display backplane 100, and second alignment is performed, to connect the first detection line 201 with the first contact electrode 101 in each even column of the display backplane 100 and connect the second detection line 202 with the second contact electrode 102 in each even column of the display backplane 100.

The detection circuit board 200 may have an area greater than the display backplane 100 because of process requirement. With the above solution, during detection, the display backplane 100 can be detected twice, that is, the contact electrode pair in each odd column of the display backplane 100 is detected at first and then the contact electrode pair in each even column of the display backplane 100 is detected, such that the problem of not being able to detect the display backplane 100 resulted by the area of the detection circuit board 200 greater than that of the display backplane 100 can be avoided.

As illustrated in FIG. 2, FIG. 7, FIG. 8, FIG. 18, and FIG. 20, in an implementation, the operation at S200 further includes the following. At S203, multiple photoresist portions 400 are provided on the display backplane 100 along a column direction of the display backplane 100, where each of the photoresist portions 400 are located between adjacent contact electrode pairs in multiple contact electrode pairs in each odd column, or each of the photoresist portions 400 are located between adjacent contact electrode pairs in multiple contact electrode pairs in each even column. The photoresist portions 400 located between adjacent contact electrode pairs in the multiple electrode pairs in each odd column are removed after completing detection for the contact electrode pairs in the odd columns of the display backplane 100. For example, the photoresist portions 400 are washed by a developing solution. Then the photoresist portions 400 are provided between adjacent contact electrode pairs in multiple contact electrode pairs in each even column. Alternatively, the photoresist portions 400 located between adjacent contact electrode pairs in the multiple contact electrode pairs in each even column are removed after completing detection for the contact electrode pairs in the even columns of the display backplane 100, and the photoresist portions 400 are provided between adjacent contact electrode pairs in the multiple contact electrode pairs in each odd column.

Based on the above technical solution, the photoresist portions 400 are provided on a region of the display backplane 100 between the adjacent contact electrode pairs in the multiple contact electrode pairs in each odd column during detection of the contact electrode pair in each odd column of the display backplane 100. The detection circuit board 200 is separated from the display backplane 100 after the contact electrode pair in each odd column of the display backplane 100 is detected, and the photoresist portions 400 located between the adjacent contact electrode pairs in the multiple contact electrode pairs in each odd column are washed by the developing solution. After that, the photoresist portions 400 are provided on a region of the display backplane 100 between the adjacent contact electrode pairs in the multiple contact electrode pairs in each even column during detection of the contact electrode pair in each even column of the display backplane 100. Detection for all of the display backplane 100 is completed after the contact electrode pair in each even column of the display backplane 100 is detected. Then the detection circuit board 200 is separated from the display backplane 100, and the photoresist portions 400 on the display backplane 100 are washed by the developing solution. The detection circuit board 200 can be adhered to the display backplane 100 through the photoresist portions 400 after the detection circuit board 200 is disposed on the display backplane 100. The photoresist portions 400 are provided respectively during detection of odd columns and detection of even columns, decreasing difficulty of detection process and ensuring normal progress of detection.

In an implementation, the photoresist portions 400 each have a height lower than or equal to the contact electrode pair, to ensure that the first detection line 201 can be connected with the first contact electrode 101 and the second detection line 202 can be connected with the second contact electrode 102 when the detection circuit board 200 is adhered to the display backplane 100.

In another implementation, operation at S200 further includes the following. At S204, the detection circuit board 200 is pressed on the display backplane 100 via a weight 500.

According to the above technical solution, the detection circuit board 200 is pressed on the display backplane 100 in a manner of putting the weight 500 on the detection circuit board 200 after the detection circuit board 200 is disposed on the display backplane 100, which ensures that when the display backplane 100 is covered by the detection circuit board 200, the first detection line 201 can be connected with the first contact electrode 101 and the second detection line 202 can be connected with the second contact electrode 102. In an implementation, the weight 500 may be a metal block, etc.

It is to be understood that the disclosure is not to be limited to the disclosed implementations. Those of ordinary skill in the art can make improvements or changes based on the above description, and all these improvements and changes should fall within the protection scope of the appended claims of this disclosure.

What is claimed is:

1. A detection structure, configured to detect a display backplane and comprising:
    a detection circuit board comprising:
        one or more first detection lines and one or more second detection lines, disposed at intervals on one side of the detection circuit board, wherein the one side faces the display backplane; and
        one or more first detection electrodes and one or more second detection electrodes, disposed at intervals on another side of the detection circuit board, wherein the another side is away from the display backplane, and wherein the first detection electrode is electrically connected with the first detection line and the second detection electrode is electrically connected with the second detection line; and
    one or more detection light-emitting diode (LED) chips each comprising:
        a first electrode and a second electrode, wherein the first electrode is electrically connected with the first detection electrode and the second electrode is electrically connected with the second detection electrode,
    wherein the first detection line is configured to be electrically connected with a first contact electrode of a contact electrode pair on the display backplane having one or more contact electrode pairs arranged in a matrix, and the second detection line is configured to be electrically connected with a second contact electrode of the contact electrode pair on the display backplane.

2. The detection structure of claim 1, wherein
    the first detection electrode and the second detection electrode are disposed on the first detection line and the second detection line in a same detection line group;
    a distance between the first detection line and the second detection line in the same detection line group is greater than or equal to a distance between two adjacent sides of the first contact electrode and the second contact electrode in a same contact electrode pair, and is less than or equal to a distance between two opposite sides of the first contact electrode and the second contact electrode in the same contact electrode pair; and
    a distance between the first detection line and the second detection line in adjacent detection line groups is greater than the distance between the two opposite sides of the first contact electrode and the second contact electrode in the same contact electrode pair.

3. The detection structure of claim 1, wherein the display backplane comprises a substrate, a circuit layer, and a planarization layer, wherein
    the circuit layer is disposed on a surface of the substrate and comprises a drive circuit, wherein the drive circuit is configured to be electrically connected with the first detection line and the second detection line; and
    the circuit layer is covered by the planarization layer, and the first contact electrode and the second contact electrode are disposed on a surface of the planarization layer.

4. The detection structure of claim 1, wherein the detection LED chip is an LED flip chip.

5. The detection structure of claim 1, wherein during detection, the detection circuit board is disposed on the display backplane, the first detection line is connected with the first contact electrode and the second detection line is connected with the second contact electrode, and the display backplane outputs a drive signal to the first detection line and the second detection line, wherein the contact electrode pair on the display backplane corresponding to a detection LED chip in the one or more detection LED chips is abnormal on condition that the detection LED chip is unlighted.

6. A detection method, applied to the detection structure of claim 1 and comprising:
    providing the display backplane, the detection circuit board, and the detection LED chip;
    disposing the detection circuit board on the display backplane, to connect the first detection line with the first contact electrode and connect the second detection line with the second contact electrode; and
    outputting a drive signal via the display backplane to the first detection line and the second detection line, and determining that the contact electrode pair on the display backplane corresponding to the detection LED chip is abnormal on condition that the detection LED chip is unlighted.

7. The detection method of claim 6, further comprising:

after outputting the drive signal via the display backplane to the first detection line and the second detection line:
separating the detection circuit board from the display backplane, and repairing the abnormal contact electrode pair on the display backplane for mass transfer.

8. The detection method of claim 6, wherein disposing the detection circuit board on the display backplane, to connect the first detection line with the first contact electrode and connect the second detection line with the second contact electrode comprises:
disposing the detection circuit board on the display backplane, and performing first alignment, to connect the first detection line with the first contact electrode in each odd column of the display backplane and connect the second detection line with the second contact electrode in each odd column of the display backplane; and
moving the detection circuit board after completing detection for the contact electrode pairs in odd columns of the display backplane, and performing second alignment, to connect the first detection line with the first contact electrode in each even column of the display backplane and connect the second detection line with the second contact electrode in each even column of the display backplane.

9. The detection method of claim 8, further comprising:
before disposing the detection circuit board on the display backplane, to connect the first detection line with the first contact electrode and connect the second detection line with the second contact electrode:
providing a plurality of photoresist portions on the display backplane along a column direction of the display backplane, wherein each of the photoresist portions is located between adjacent contact electrode pairs in a plurality of contact electrode pairs in each odd column, or each of the photoresist portions is located between adjacent contact electrode pairs in a plurality of contact electrode pairs in each even column; and
removing the photoresist portions located between adjacent contact electrode pairs in the plurality of contact electrode pairs in each odd column after completing detection for the contact electrode pairs in the odd columns of the display backplane, and providing the photoresist portions between adjacent contact electrode pairs in a plurality of contact electrode pairs in each even column; or
removing the photoresist portions located between adjacent contact electrode pairs in the plurality of contact electrode pairs in each even column after completing detection for the contact electrode pairs in the even columns of the display backplane, and providing the photoresist portions between adjacent contact electrode pairs in a plurality of contact electrode pairs in each odd column.

10. The detection method of claim 9, wherein the photoresist portions each have a height lower than or equal to the contact electrode pair.

11. The detection method of claim 8, wherein disposing the detection circuit board on the display backplane, to connect the first detection line with the first contact electrode and connect the second detection line with the second contact electrode further comprises:
pressing the detection circuit board on the display backplane via a weight.

12. The detection method of claim 6, wherein outputting the drive signal via the display backplane to the first detection line and the second detection line comprises:
applying, by a drive circuit on the display backplane, an electrical signal to the first detection line and the second detection line row by row.

13. A detection method, applied to the detection structure of claim 1 and comprising:
providing the display backplane, the detection circuit board, and the detection LED chip;
disposing the detection circuit board on the display backplane, to connect the first detection line with the first contact electrode and connect the second detection line with the second contact electrode;
outputting a drive signal via the display backplane to the first detection line and the second detection line, and applying, by a drive circuit on the display backplane, an electrical signal to the first detection line and the second detection line row by row;
determining that the contact electrode pair on the display backplane corresponding to the detection LED chip is abnormal on condition that the detection LED chip is unlighted; and
separating the detection circuit board from the display backplane, and repairing the abnormal contact electrode pair on the display backplane for mass transfer.

14. The detection method of claim 13, wherein disposing the detection circuit board on the display backplane, to connect the first detection line with the first contact electrode and connect the second detection line with the second contact electrode comprises:
disposing the detection circuit board on the display backplane, and performing first alignment, to connect the first detection line with the first contact electrode in each odd column of the display backplane and connect the second detection line with the second contact electrode in each odd column of the display backplane; and
moving the detection circuit board after completing detection for the contact electrode pairs in odd columns of the display backplane, and performing second alignment, to connect the first detection line with the first contact electrode in each even column of the display backplane and connect the second detection line with the second contact electrode in each even column of the display backplane.

15. The detection method of claim 14, further comprising:
before disposing the detection circuit board on the display backplane, to connect the first detection line with the first contact electrode and connect the second detection line with the second contact electrode:
providing a plurality of photoresist portions on the display backplane along a column direction of the display backplane, wherein each of the photoresist portions are located between adjacent contact electrode pairs in a plurality of contact electrode pairs in each odd column, or each of the photoresist portions are located between adjacent contact electrode pairs in a plurality of contact electrode pairs in each even column;
removing the photoresist portions located between adjacent contact electrode pairs in the plurality of contact electrode pairs in each odd column after completing detection for the contact electrode pairs in the odd columns of the display backplane, and providing the photoresist portions between adjacent contact electrode pairs in a plurality of contact electrode pairs in each even column; or removing the photoresist portions located between adjacent contact electrode pairs in the plurality of contact electrode pairs in each even column after completing detection for the contact electrode pairs in the even columns of the display backplane, and providing the photoresist portions between adjacent contact electrode pairs in a plurality of contact electrode pairs in each odd column.

16. The detection method of claim 15, wherein the photoresist portions each have a height lower than or equal to the contact electrode pair.

17. The detection method of claim 15, wherein disposing the detection circuit board on the display backplane, to connect the first detection line with the first contact electrode and connect the second detection line with the second contact electrode further comprises:

pressing the detection circuit board on the display backplane via a weight.

* * * * *